United States Patent [19]
Su et al.

[11] Patent Number: 5,893,757
[45] Date of Patent: Apr. 13, 1999

[54] TAPERED PROFILE ETCHING METHOD

[75] Inventors: Yuh-Jia Su, Taipai, Taiwan; Yuen-Kui Wong, Fremont; Kam S. Law, Union City, both of Calif.

[73] Assignee: Applied Komatsu Technology, Inc., Tokyo, Japan

[21] Appl. No.: 08/783,819

[22] Filed: Jan. 13, 1997

[51] Int. Cl.$^6$ .................................................. H01L 21/00
[52] U.S. Cl. .................. 438/713; 438/701; 438/719; 438/725; 216/58; 216/67; 252/79.1
[58] Field of Search .................. 438/701, 713, 438/719, 720, 723, 725; 252/79.1; 216/23, 24, 58, 67, 77, 79

[56] References Cited

U.S. PATENT DOCUMENTS

| | | | |
|---|---|---|---|
| 3,986,912 | 10/1976 | Alcorn et al. | 438/713 |
| 4,436,584 | 3/1984 | Bernacki et al. | 438/713 X |
| 4,456,501 | 6/1984 | Bayman et al. | 438/713 X |
| 4,595,452 | 6/1986 | Landau et al. | 438/713 |
| 4,631,248 | 12/1986 | Pasch | 438/713 |
| 4,806,199 | 2/1989 | Gualandris | 438/713 X |

*Primary Examiner*—William Powell
*Attorney, Agent, or Firm*—Fish & Richardson

[57] ABSTRACT

A method of etching an article having a substrate, an etchable film and a mask layer having a pattern formed therein includes the step of exposing the article to an etchant gas mixture which includes a halogen-containing gas and an inert gas. An etching profile is formed which is substantially smooth across an interface between the etchable film and the mask layer. The method is particularly useful in producing components of articles such as flat-panel displays.

36 Claims, 2 Drawing Sheets

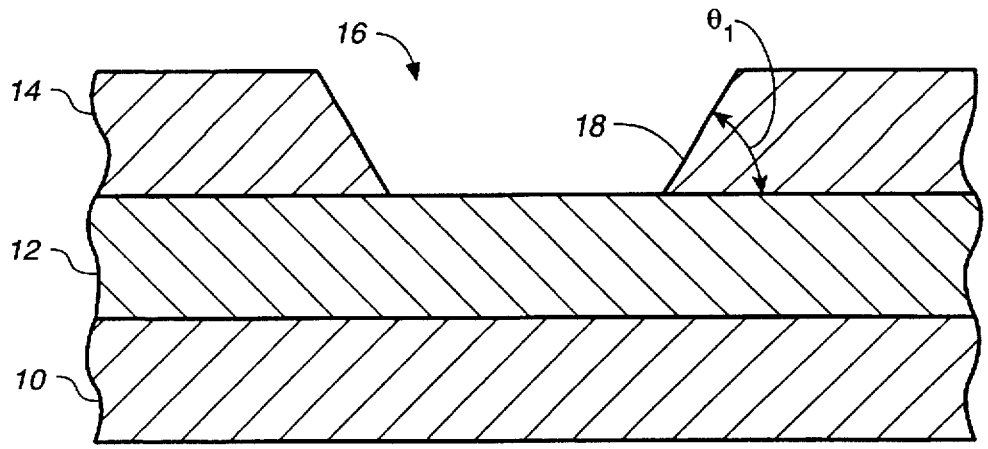
FIG._1 (PRIOR ART)
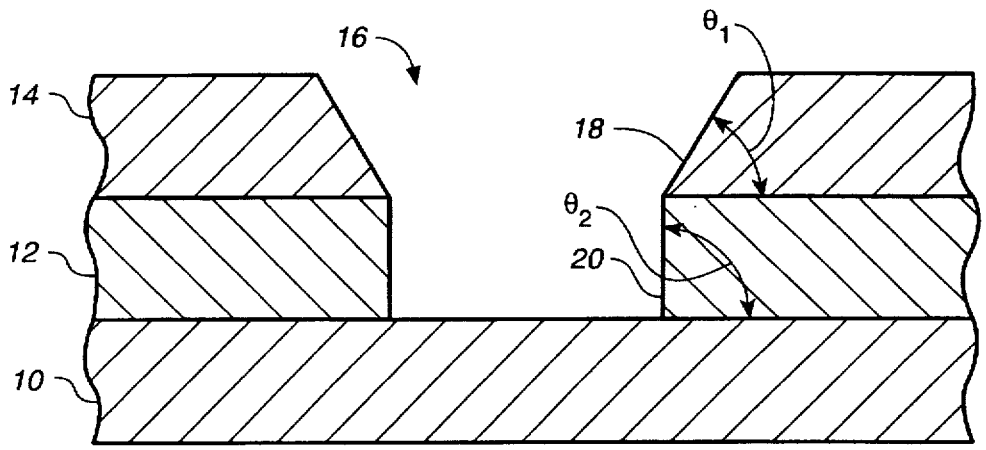
FIG._2 (PRIOR ART)
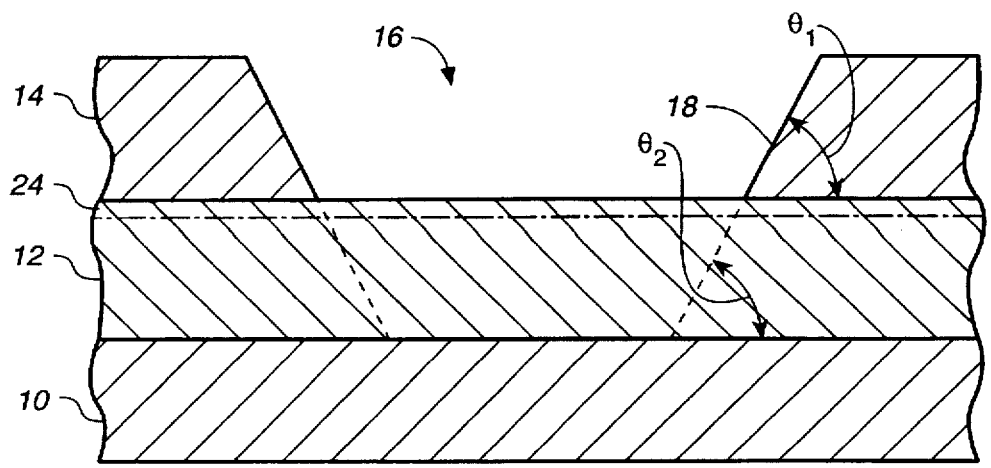
FIG._3

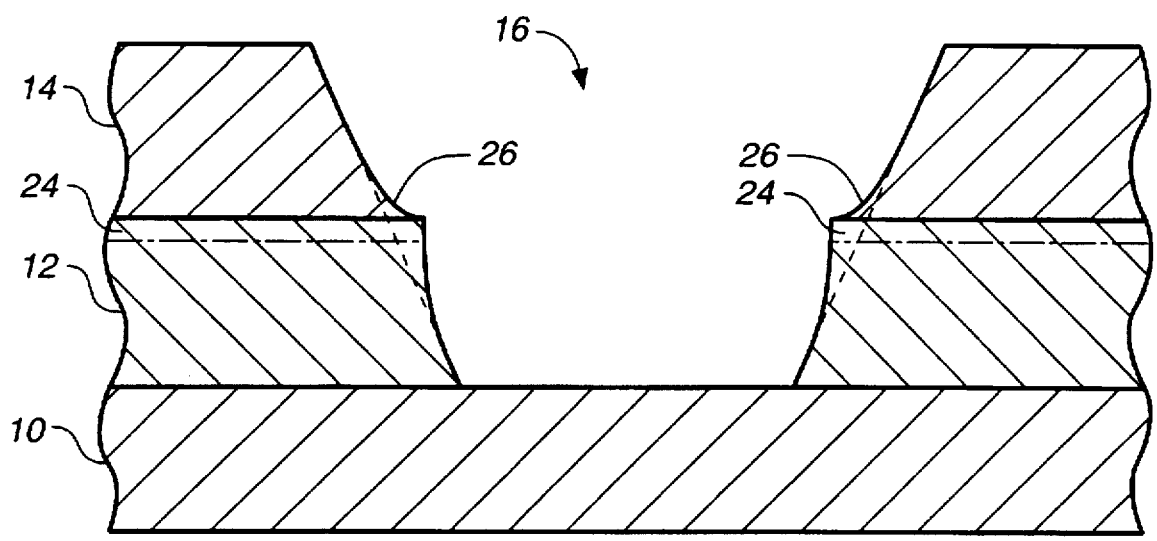
FIG._4
*(PRIOR ART)*
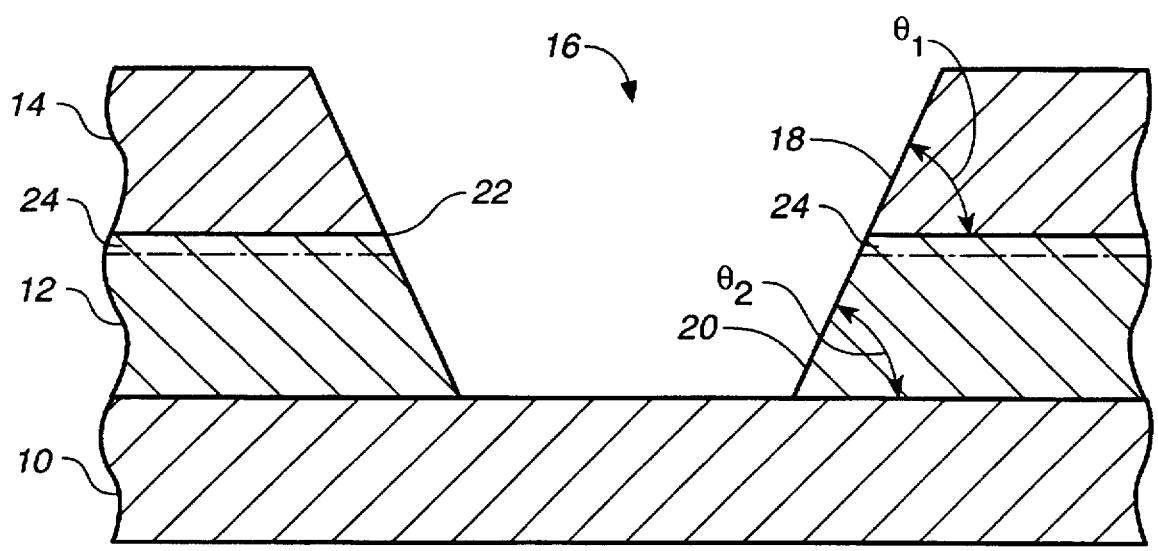
FIG._5

TAPERED PROFILE ETCHING METHOD

FIELD OF THE INVENTION

The present invention relates generally to an etching method which produces a continuous, substantially smooth etching profile, and more particularly to a method for etching using an etchant gas mixture of a halogen gas and an inert gas.

BACKGROUND OF THE INVENTION

Conventional etching methods typically include the steps of applying a photoresist to an article having an etchable film, for example, aluminum or amorphous silicon, supported on a substrate. The photoresist is selectively exposed and developed to form a mask layer over the film. The portions of the film not covered by the mask layer are etched to remove the exposed portions of the etchable film. Finally, the mask layer is removed, for example, by use of a solvent.

Known etching processes include "wet" etching. In a wet etching process, the article to be etched is exposed to an etching solution, such as a solution including hydrofluoric acid (HF). Wet etching processes are described, for example, in S. Ghandhi, VLSI *Fabrication Principles* (2d. Ed., John Wiley & Sons, Inc., New York, N.Y. 1994), pp. 589–613.

Wet etching processes, however, suffer from various disadvantages. For example, it is usually impracticable to change the etching solution after each article is processed; etching solutions typically are changed once per week. As a result, particles and residues accumulate in the etching solution. These accumulations tend to reduce the quality of the etching over time. Another problem is lack of uniformity. Wet etching processes are often incapable of uniformly removing an exposed etchable film over the entire exposed surface of the article, and in particular can suffer from undercutting of the etchable film. Such processes furthermore require a substantial area for the required etching tanks, rinsing tanks, drying apparatus, etc. Finally, wet etching processes, particularly those using strong etchant solutions and/or organic solvents, are environmentally hostile and generate significant disposal problems.

Dry etching methods avoid many of the problems associated with wet etching methods in the production of integrated circuits. Dry etching methods are described, for example, in the above-noted publication at pp. 613–624. Such methods include dry physical etching methods, such as ion beam etching and sputter etching, and dry chemical etching. Dry etching methods typically utilize fewer chemicals and in smaller quantities, are readily automated, and give rise to fewer disposal problems.

In producing integrated circuits, it is important that the etching process employed produce a substantially vertical profile in the etched film. FIGS. 1 and 2 illustrate a conventional dry etching process. In FIG. 1, an article including a substrate 10, an etchable film 12 (for example, an aluminum film or an amorphous silicon film), and a mask layer 14 in which a pattern 16 is formed is exposed to an etchant gas. Alternatively, the article can be subjected to plasma etching. Mask layer 14 has a mask surface 18 which forms a first etch angle $\theta_1$, with respect to etchable film 12. After removal of the exposed portion of etchable film 12 by the selected etching process, the surface 20 of the etchable film 12 forms a second etch angle $\theta_2$ with respect to substrate 10, as shown in FIG. 2. Surface 20 preferably forms an angle $\theta_2$ of about 85°–90°, preferably approximately 90°.

In the illustrated process, etchable film 12 etches at rate $R_F$, and mask layer 14 etches at rate $R_M$. The ratio of the two rates, $R_F/R_M$, preferably is substantially greater than one, and is typically about 4 to 10. The high etch rate of film 12 with respect to mask layer 14 enables formation of a substantially vertical etching profile in film 12, as shown in FIG. 2.

In other applications, however, such as the production of flat panel displays (FPDs), it is important to produce a profile which is inclined with respect to the vertical, i.e., a tapered profile. As shown in FIG. 3, it may be desired to produce an etch angle $\theta_2$ in etchable layer 12 which is between about 15° and 60°. To produce such a tapered profile, it is desirable that the respective etch rates of film 12 and mask layer 14 are more nearly equal in value, preferably such that the ratio $R_F/R_M$ is less than about 2, very preferably between about 1 and 2.

Problems arise in producing tapered profiles. It is difficult, for example, to achieve the desired low ratio of $R_F$ to $R_M$ with known dry etching techniques. More significantly, it is difficult to completely etch the interface 22 at which etchable film 12 and mask layer 14 meet. The difficulty arises due the presence of oxidation products, such as alumina ($Al_2O_3$) in the case of an aluminum film 12 or silicon dioxide ($SiO_2$) in the case of an amorphous silicon film 12, which may be present in a surface region 24 of film 12, and/or the presence of mask residues. If interface 22 is etched at a lower rate than mask 14 and film 12, a "ledge" 26 is formed at interface 22, as shown in FIG. 4, and a continuous tapered contour cannot be produced.

In known processes for producing a tapered etch profile, chlorine-based etching chemistry is frequently employed. For example, when etchable film 12 is an aluminum film, boron chloride ($BCl_3$) and chlorine gas ($Cl_2$) are employed. Initially, $BCl_3$ removes the $Al_2O_3$ oxidation products from surface region 24 of the exposed aluminum film 12. The mixture of $BCl_3$ and $Cl_2$ is then used to etch aluminum film 12 and mask 14. However, the gas mixture does not remove the $Al_2O_3$ from interface 22 as effectively as it removes film 12 and mask 14. This again results in formation of a ledge 26, preventing a smooth etch profile from being formed across film 12 and mask layer 14.

Processes for etching a film 12 of other known materials also encounter problems with ledge formation. When film 12 is an amorphous silicon film, $BCl_3$ typically removes the silicon oxidation products from surface region 24 of exposed silicon film 12. $Cl_2$ is then used to etch silicon film 12. Again, $Cl_2$ does not remove the silicon from interface 22 at the same rate as it removes film 12 and mask layer 14, and a tapered contour cannot readily be formed.

A need exists for a dry etching method that enables production of an etched article, such as a FPD, having a smooth, continuous tapered etch profile which is substantially free of ledges and other irregularities.

SUMMARY OF THE INVENTION

In one aspect, the present invention is directed to a method of etching an article including a substrate, an etchable film and a mask layer. The method includes the steps of forming a pattern in the mask layer and exposing the article to an etchant gas mixture which includes a halogen-containing gas and an inert gas. By use of the inventive etchant gas mixture, an etching profile is formed which is substantially smooth across an interface between the etchable film and the mask layer.

Implementations of the method include the following. The etching profile includes a first segment across the etchable film which forms a first angle $\theta_1$ with the substrate.

A second segment across the mask layer forms a second angle $\theta_2$ with the etchable layer. The first and second angles differ by less than about 15°. The film etches at a rate $R_F$ and the mask layer etches at a rate $R_M$ such that the ratio $R_F/R_M$ is less than or equal to 2, and in particular is between about 1 and 2.

The etching gas mixture comprises (a) a halogen-containing gas or combination of halogen-containing gases, and (b) an inert gas or combination of inert gases.

Halogen-containing gases for use in the inventive etchant gas mixture include chlorine-containing gases and fluorine-containing gases. The halogen-containing gas may be a chlorine-containing gas such as molecular chlorine, boron trichloride, carbon tetrachloride, or mixtures thereof.

Inert gases for use in the inventive etchant gas mixture may be noble gases, more preferably helium, argon, xenon or mixtures thereof.

The halogen-containing gas and the inert gas are present in the etchant gas mixture in a ratio of about 75:25 to 40:60, and more particularly from about 70:30 to 40:60. The etching step is carried out at a pressure of about 5–50 millitorr and a power of about 0.1–2.0 W/cm$^2$.

The inventive method may be particularly useful in etching films such as amorphous silicon and aluminum in order to produce etching profiles that are substantially smooth. The mask layer may be a polymeric photoresist layer. The etchant gas mixture may further include oxygen.

In another aspect, the present invention is directed to a method of etching an article including a substrate, an etchable film and a mask layer, including steps of forming a pattern in a polymeric photoresist layer of the mask layer, exposing the article to an etchant gas mixture including a chlorine-containing gas and a noble gas, such that an etching profile is formed which is substantially smooth across an interface between the etchable film and the mask layer.

In accordance with another aspect of the present invention, a method of producing an etched article includes the steps of forming a mask layer including a polymeric photoresist on an article having a substrate and an etchable film, thus producing an article having an interface between the etchable film and the mask layer, forming a pattern in the mask layer by selectively exposing and developing the mask layer, etching the article by exposing the article to an etchant gas mixture including a chlorine-containing gas and a noble gas to form the pattern in the etchable layer, such that an etching profile is formed which is substantially smooth across the interface between the etchable film and the mask layer, and removing the mask layer.

In another aspect, the invention is directed to a method of producing an etched article including steps of forming a mask layer having a polymeric photoresist on an article including a substrate and an etchable film, thereby producing an article having an interface between the etchable film and the mask layer. A pattern is formed in the mask layer by selectively exposing and developing the mask layer. Other steps include etching the article by exposing the article to an etchant gas mixture including a chlorine-containing gas and a noble gas to form the pattern in the etchable layer, whereby an etching profile is formed which is substantially smooth across the interface between the etchable film and the mask layer, and removing the mask layer.

In another aspect, the invention is directed to an article produced by the above methods. The article may be a component of an FPD.

Additional advantages of the invention will be set forth in the description which follows, and in part will be obvious from the description, or may be learned by practice of the invention. The advantages of the invention may be realized and obtained by means of the instrumentalities and combinations particularly pointed out in the claims.

BRIEF DESCRIPTION OF THE DRAWINGS

The accompanying drawings, which are incorporated in and constitute a part of the specification, schematically illustrate the invention and, together with the general description given above and the detailed description given below, serve to explain the principles of the invention.

FIGS. 1 and 2 illustrate a prior art conventional dry etching process for an integrated circuit, in which a substantially vertical etching profile is formed in an etchable film, with FIG. 1 showing a cross-section of an article comprising a substrate, an etchable film and a mask layer prior to the etching process and FIG. 2 showing the same cross-section after completion of the etching process. In the figures, $\theta_1$ is the etch angle formed by the mask layer with the etchable film, and $\theta_2$ is the etch angle formed by the etchable film with the substrate.

FIG. 3 is a diagram illustrating the etching profile which may be required for production of an FPD.

FIG. 4 is a cross-sectional view of an etched article with a tapered etching profile produced according to a prior art method, in which the desired smooth etching profile is interrupted by formation of ledges at the interface between the etchable film and the mask layer.

FIG. 5 is a cross-sectional view of an etched article with a tapered etching profile produced according to an embodiment of the present invention, showing a smooth profile in which $\theta_1$ and $\theta_2$ are approximately equal.

In the figures, like elements are numbered identically throughout.

DESCRIPTION OF THE PREFERRED EMBODIMENTS

Use of an inert gas, such as argon or another noble gas, or combinations thereof, as a component of a halogen-containing etchant gas mixture enables substantially smooth, continuous etching profiles to be formed. The inventive etchant gas mixture is thus particularly suitable for producing etched articles, such as FPD's, which require non-vertical etching profiles.

The term "etchable film" as used herein denotes a film that is subject to etching by an etchant gas mixture upon exposure thereto, and that remains present in unexposed areas of the article after completion of the etching process. The etchable film may in particular include an upper portion that is at least partially oxidized. Exemplary etchable films include films of amorphous silicon and aluminum films.

The term "mask layer" as used herein denotes a layer in which is defined a pattern, typically formed by selective exposure and development of a polymerizable photoresist composition, and that is completely removed from the article after completion of the etching process.

The term "etching profile" as used herein denotes a cross-sectional profile formed by the underlying etchable film and the overlying mask layer after completion of the etching process. The etching profile includes a first segment on an edge of the etchable film, which forms a first etch angle $\theta$, with the substrate, and a second segment across the mask layer, which forms a second etch angle $\theta_1$ with the etchable layer (and possibly also with the substrate).

The term "interface" as used herein denotes the plane of contact between the etchable film and the mask layer. When used in the context of an etching profile, the term "interface" in particular denotes the point on the etching profile at which the etchable film contacts the mask layer.

A "substantially smooth" etching profile as used herein is an etching profile which is substantially free of discontinuities, such as ledges, at the interface. More specifically, the first etch angle $\theta_1$, and the second etch angle $\theta_2$ discussed above do not substantially differ. For example, the two etch angles do not differ by more than about 15°. In particular, the etch angles $\theta_1$ and $\theta_2$ may be approximately equal.

The etchant gas mixture employed according to the present invention includes a halogen-containing gas, which may be a chlorine-containing gas or a fluorine-containing gas. Particular chlorine-containing gases which can be used in the etchant gas mixture include $Cl_2$, $BCl_3$, carbon tetrachloride ($CCl_4$) and combinations thereof. Other known chlorine-containing gases used in known dry etching processes can also be used. Selection of a specific chlorine-containing gas or mixture of chlorine-containing gases depends on factors such as the type of etchable film to be etched.

In addition to a halogen-containing gas or combinations thereof, the etchant gas mixture employed according to the invention includes at least one inert gas. The inert gas may be a noble gas, in particular helium (He), argon (Ar) or xenon (Xe). Argon is useful due to its ready availability and low cost. Combinations of noble gases, such as Ar/He or Ar/Xe, can also be employed.

The halogen-containing gas or gases, and the inert gas or gases, may be present in the inventive etchant gas mixture in a ratio from about 75:25 to 40:60. Thus, the flowrate of the inert gas or combination of inert gases during the etching process of the invention varies from about 30 to 60% of the total etchant gas flowrate.

In general, higher inert gas flowrates result in slower etch rates, but also afford greater uniformity in the etch profile, that is, a smaller difference between the first and second etch angles $\theta_1$ and $\theta_2$. Conversely, lower inert gas flowrates (and thus, higher halogen-containing gas flowrates) generally afford a higher etch rate, but may also result in a greater difference between the first and second etch angles $\theta_1$ and $\theta_2$. Thus, lower inert gas flowrates tend to achieve a slightly less smooth etching profile, although still significantly smoother than etching profiles produced by known etching gas mixtures which do not include an inert gas. The desired etch rate and etching profile uniformity can be chosen through selection of the halogen-containing gas or gases, the inert gas or gases, and the relative proportions of each component in the etching gas mixture.

In contrast to known dry etching processes in which the etching rate $R_F$ of the etchable film is significantly greater than the etching rate $R_M$ of the mask layer, such that the ratio $R_F/R_M$ is about 4 to 10, the corresponding ratio afforded by the present invention can be limited to less than about 2, and preferably to between about 1 and 2.

The inventive etching gas mixture can be used in a variety of etching processes, including presently known etching processes for producing FPDs. One process may use a polymerizable photoresist to form the mask layer. The formation of the initial angle $\theta_1$ in the mask layer, after development of the photoresist and prior to exposure of the article to the etching gas mixture, can be caused by a reflow step (i.e., by heating the mask layer to a high temperature, typically about 120° C.). Other known methods, such as UV curing, can also be employed if desired.

Many known etching devices, including those presently employed in producing FPDs, can be utilized to carry out the inventive etching methods. One particularly useful apparatus for carrying out the inventive etching methods is the Applied Komatsu Technology (AKT) Etcher 1600 or AKT Etcher 3500, available from AKT of Santa Clara, Calif. Details of such apparatuses are included in U.S. patent application Ser. Nos. 08/273,382 and 08/732,968, co-owned by the assignee of the present invention and hereby incorporated by reference.

Etching methods according to the invention preferably are carried out under low pressure and high power. Preferred pressures range from about 5–50 millitorr, more preferably about 10 to 15 millitorr. Preferred powers range from about 0.1 to 2.0 W/cm$^2$, more preferably about 0.2 to 1.0 W/cm$^2$. Etching times will vary depending on the thickness and composition of the layer to be etched. Typical etching times range from about 0.5 to 5 minutes. For example, etchable layers of amorphous silicon or aluminum, having a thickness of about 3000 Å, can be etched in about 2 minutes at the pressure and power conditions exemplified above.

The inventive method may operate as follows. By using an etchant gas mixture including a halogen-containing gas and an inert gas in a dry etching method, etching occurs by two independent mechanisms: halogen etching and sputtering. At the preferred low pressures and high powers, the sputtering mechanism is enhanced. This sputtering increases the effectiveness of the gas etching mixture in removing interfacial materials, such as $Al_2O_3$ in the case of an aluminum etchable layer or $SiO_2$ in the case of an amorphous silicon etchable layer, as well as mask residues. Consequently, the formation of "ledges" and other irregularities at the interface between the etchable film and the mask layer is reduced, and the resultant etching profile is substantially smooth and continuous across the interface.

FIG. 5 illustrates an etched article produced in accordance with the method of the present invention, in which tapered mask surface 18 and tapered etchable film surface 20 form etch angles $\theta_1$ and $\theta_2$, respectively, which are approximately equal. The etched article has the desired smooth etching profile across the interface between etchable film 12 and mask layer 14, with no ledge formation.

As mentioned, an etchant gas mixture according to the invention can be used in presently known etching methods, such as those etching methods used to produce FPDs. The inventive etchant gas mixture can also be used in combination with oxygen in processes that presently employ oxygen as a component of the etchant gas.

The present invention is further illustrated by the following non-limiting examples.

EXAMPLE 1

Aluminum film etching

An article is prepared having layers including a glass substrate, an Al film having a thickness of 3000 Å, and a polymeric photoresist mask layer. The article is selectively exposed and developed to produce a pattern in the mask layer. The mask layer after development forms an etch angle $\theta_2$ of 45° with respect to the underlying Al film.

The article is subsequently etched in an AKT Etcher using an etchant gas mixture according to an embodiment of the present invention. The etchant gas has a total gas flow rate of 155 standard cubic centimeters per minute (sccm), and has the following composition: 70 sccm Ar, 20 sccm $BCl_3$ and 65 sccm $Cl_2$. These values were used in a chamber having a volume 180 liters, and would scale for larger or smaller chambers accordingly. For example, the Ar flow rate could be about 0.4 sccm per liter of chamber volume. The flowrate was maintained constant during the etching process. The etching process was carried out at a pressure of 10 millitorr and a power density of 1 W/cm² for 2 minutes.

After completion of the etching step, the etching profile across the mask-Al layer interface is smooth and forms etch angles $\theta_1$, $\theta_2$ of 45°.

EXAMPLE 2
Amorphous silicon film etching

An article is prepared having layers including a glass substrate, an amorphous silicon film having a thickness of 3000 Å, and a polymeric photoresist mask layer. The article is selectively exposed and developed to produce a pattern in the mask layer. The mask layer after development forms an etch angle $\theta_2$ of 45° with respect to the underlying amorphous silicon film.

The article is subsequently etched in an AKT Etcher using an etchant gas mixture of the present invention. The etchant gas has a total 145 sccm, and has the following composition: 70 sccm Ar and 75 sccm Cl₂. The flowrate was maintained constant during the etching process. Flowrates in the range of 10 to 1000 sccm for Ar and 10 to 500 sccm for Cl₂ may also be used. The etching process was carried out at a pressure of 10 millitorr and a power density of 0.4 W/cm² for about two minutes. Power densities of about 0.1 W/cm² to 5 W/cm² may generally be used.

After completion of the etching step, the etching profile across the mask-silicon layer interface is smooth and forms etch angles $\theta_1$, $\theta_2$ of 45°.

EXAMPLE 3
FPD production

An article is prepared including layers of a glass substrate, an amorphous silicon film having a thickness of 3000 Å, and a polymeric photoresist mask layer defining a pattern for use in an FPD. The article is etched as in EXAMPLE 2, and the mask layer is subsequently removed. The etched article is suitable for use in manufacturing an FPD.

The present invention thus affords an improved method for producing an etching profile which is smooth and free from ledges and other interfacial irregularities. The method requires only one etchant gas composition for use during the entire etching process, and is particularly useful for producing articles such as FPDs which require non-vertical etching profiles.

The present invention has been described in terms of a preferred embodiment. The invention, however, is not limited to the embodiment depicted and described. Rather, the scope of the invention is defined by the appended claims.

What is claimed is:

1. A method of dry etching an article including a substrate, an etchable film and a mask layer, comprising:
   forming a pattern in said mask layer by selectively exposing and developing said mask layer;
   exposing said article to an etchant gas mixture including a halogen-containing gas and an inert gas; and
   dry etching the etchable film at a pressure of about 5–50 millitorr to produce a tapered etching profile terminating at the substrate and substantially smooth across an interface between said etchable film and said mask layer.

2. A method of dry etching an article including a substrate, an etchable film an a mask layer, comprising:
   forming a pattern in said mask by selectively exposing and developing said mask layer;
   exposing said article to an etchant gas mixture including a halogen-containing gas and an inert gas; and
   forming an etching having a tapered etching profile which is substantially smooth across an interface between said etchable film and said mask layer,
   wherein a first segment across said etchable film forms a first angle $\Theta_1$ with said substrate,
   wherein a second segment across said mask layer forms a second angle $\theta_1$ with said etchable layer, and
   wherein said first and second angles differ by less than about 15°.

3. The method of claim 1, wherein said etchant gas mixture is at least partially in the form of a plasma.

4. The method of claim 2 wherein said etchable film etches at a rate $R_F$ and said mask layer etches at a rate $R_M$ such that the ratio $R_F/R_M$ is less than or equal to 2.

5. The method of claim 4 wherein $R_F/R_M$ is between about 1 and 2.

6. The method of claim 1 wherein said halogen-containing gas is a chlorine-containing gas or a fluorine-containing gas.

7. The method of claim 6 wherein said chlorine-containing gas is selected from the group consisting of molecular chlorine, boron trichloride, carbon tetrachloride and combinations thereof.

8. The method of claim 1 wherein said inert gas is a noble gas.

9. The method of claim 8 wherein said noble gas is selected from the group consisting of helium, argon, xenon and combinations thereof.

10. The method of claim 8 wherein said noble gas is argon.

11. The method of claim 2 wherein said halogen-containing gas and said inert gas are present in a ratio having a range of from about 75:25 to about 40:60.

12. The method of claim 11 wherein the ratio has a range of from about 70:30 to about 40:60.

13. The method of claim 2 wherein said etching step is carried out at a power of about 0.1 to 2.0 W/cm².

14. The method of claim 1 wherein said etching step is carried out at for a time from about 0.5 to 5 minutes.

15. The method of claim 1 wherein said etchable film is selected from the group consisting of amorphous silicon and aluminum.

16. The method of claim 1 wherein said mask layer is a polymeric photoresist layer.

17. The method of claim 1 wherein said etchant gas mixture further comprises oxygen.

18. A product produced by dry etching an article including a glass substrate, an etchable film and a mask layer, comprising:
   forming a pattern in said mask layer by selectively exposing and developing said mask layer;
   exposing said article to an etchant gas mixture including a halogen-containing gas and an inert gas; and
   forming an etching having a tapered etching profile substantially smooth across an interface between said etchable film and said mask layer,
   wherein said etchable film etches at a rate $R_F$ and said mask layer etches at a rate $R_M$ such that the ratio $R_F/R_M$ is less than or equal to about 2.

19. The product of claim 18 adapted to be used in a flat-panel display.

20. A method of dry etching an article including a substrate, an etchable film and a mask layer, comprising the steps of:
   forming a pattern in a polymeric photoresist layer of said mask layer;
   exposing said article to an etchant gas mixture including a chlorine-containing gas and a noble gas; and dry etching the etchable film at a pressure of about 5–50 millitorr to produce a tapered etching profile terminating at the substrate and substantially smooth across an interface between the etchable film and said mask layer.

21. A method of dry etching an article including a substrate, an etchable film and a mask layer, comprising:

forming a pattern in a polymeric photoresist layer of said mask layer, exposing said article to an etchant gas mixture including a chlorine-containing gas and a noble gas, and forming an etching having a tapered etching profile which is substantially smooth across an interface between an interface between said etchable film an said mask layer, wherein a first segment across said etchable film which forms at a first angle $\theta_1$ with said substrate and a second segment across said mask layer which forms a second angle $\theta_1$ with said etchable layer, and wherein said first and second angles differ by less than about 15°.

22. The method of claim 21 wherein said etchable film etches at a rate $R_F$ and said mask layer etches at a rate $R_M$ such that the ratio $R_F/R_M$ is less than or equal to about 2.

23. The method of claim 22 wherein $R_F/R_M$ is between about 1 and 2.

24. The method of claim 21 wherein said chlorine-containing gas is selected from the group consisting of molecular chlorine, boron trichloride, carbon tetrachloride and mixtures thereof.

25. The method of claim 21 wherein said noble gas is selected from the group consisting of helium, argon, xenon and mixtures thereof.

26. The method of claim 21 wherein said chlorine-containing gas and said noble gas are present in a ratio from about 75:25 to 40:60.

27. The method of claim 21 wherein said etchable film is selected from the group consisting of amorphous silicon and aluminum.

28. A product produced by dry etching an article including a glass substrate, an etchable film and a mask layer, comprising:

forming a pattern in a polymeric photoresist layer of said mask layer;

exposing said article to an etchant gas mixture including a chlorine-containing gas and a noble gas; and forming an etching having a tapered etching profile terminating at the substrate and substantially smooth across an interface between said etchable film and said mask layer, wherein said film etches at a rate $R_F$ and said mask layer etches at a rate $R_M$ such that the ratio $R_F/R_M$ is less than or equal to about 2.

29. A method of producing an etched article, comprising the steps of:

forming a mask layer comprising a polymeric photoresist on an article including a substrate and an etchable film;

producing an article having an interface between said etchable film and said mask layer;

forming a pattern in said mask layer by selectively exposing and developing said mask layer;

dry etching said article by exposing said article to an etchant gas mixture including a chlorine-containing gas and a noble gas at a pressure of about 5–50 millitorr;

forming said pattern in said etchable layer;

forming an etching having a tapered etching profile terminating at the substrate and substantially smooth across said interface between said etchable film and said mask layer; and removing said mask layer.

30. A method of producing an etched article, comprising:

forming a mask layer comprising a polymeric photoresist on an article including a substrate and an etchable film;

producing an interface between said etchable film and said mask layer;

forming a pattern in said mask layer by selectively exposing and developing said mask layer;

dry etching said article by exposing said article to an etchant gas mixture comprising a chlorine-containing gas and a noble gas;

forming said pattern in said etchable layer;

forming an etching having a tapered etching profile which is substantially smooth across said interface between said etchable film and said mask layer; and removing said mask layer, wherein said film etches at a rate $R_F$ and said mask layer etches at a rate $R_M$ such that the ration $R_F/R_M$ is less than or equal to 2.

31. The method of claim 30 wherein $R_F/R_M$ is between about 1 and 2.

32. The method of claim 30 wherein said chlorine-containing gas is selected from the group consisting of molecular chlorine, boron trichloride, carbon tetrachloride and mixtures thereof.

33. The method of claim 30 wherein said noble gas is selected from the group consisting of helium, argon, xenon and mixtures thereof.

34. The method of claim 30 wherein said chlorine-containing gas and said noble gas are present in a ratio from about 75:25 to 40:60.

35. A product produced by dry etching an article, comprising:

forming a mask layer including a polymeric photoresist on an article comprising a glass substrate and an etchable film;

producing an interface between said etchable film and said mask layer;

forming a pattern in said mask layer by selectively exposing and developing said mask layer;

dry etching said article with an etchant gas mixture comprising a chlorine-containing gas and a noble gas;

forming said pattern in said etchable layer;

forming an etching having a tapered etching profile terminating at the glass substrate and substantially smooth across said interface between said etchable film and said mask layer; and removing said mask layer, wherein the film etches at a rate $R_F$ and said mask layer etches at a rate $R_M$ such that the ratio $R_F/R_M$ is less than or equal to about 2.

36. An etching gas mixture for dry etching an article having a glass substrate, comprising:

(a) a halogen-containing gas or a combination of halogen-containing gases, and (b) an inert gas or a combination of inert gases, wherein the proportions of said components (a) and (b) in said etching gas mixture range from about 75:25 to 40:60.

* * * * *